(12) United States Patent
Kubota

(10) Patent No.: US 6,531,257 B2
(45) Date of Patent: Mar. 11, 2003

(54) PHOTOSENSITIVE COPPER PASTE AND METHOD OF FORMING COPPER PATTERN USING THE SAME

(75) Inventor: Masahiro Kubota, Otsu (JP)

(73) Assignee: Murata Manufacturing Co. Ltd (*) Notice: Subject to any disclaimer, the term of this patent is extended or adjusted under 35 U.S.C. 154(b) by 0 days.

(21) Appl. No.: 09/998,354

(22) Filed: Nov. 30, 2001

(65) Prior Publication Data
US 2002/0106577 A1 Aug. 8, 2002

(30) Foreign Application Priority Data
Nov. 30, 2000 (JP) ........................ 2000-365280

(51) Int. Cl.[7] .................. G03C 1/62; G03C 1/725; G03C 11/12; G03F 7/38; G03F 7/40
(52) U.S. Cl. .................. 430/198; 430/15; 430/16; 430/169; 430/192; 430/195; 430/258; 430/260; 430/270.1; 430/280.1; 430/281.1; 430/311; 430/327; 430/330; 430/910
(58) Field of Search .................. 430/198, 258, 430/260, 330, 311, 910, 281.1, 270.1, 280.1, 327, 169, 192, 195, 15, 17

(56) References Cited

U.S. PATENT DOCUMENTS 3,443,944 A * 5/1969 Wise ........................ 430/198
3,958,996 A * 5/1976 Inskip ........................ 430/198
4,598,037 A * 7/1986 Felten ........................ 430/198

FOREIGN PATENT DOCUMENTS

| JP | 05-287221 | 11/1993 |
| JP | 06-224538 | 8/1994 |
| JP | 08-227153 | 9/1996 |
| JP | 08-335757 | 12/1996 |
| JP | 09-218508 | 8/1997 |
| JP | 09-218509 | 8/1997 |
| JP | 09-222723 | 8/1997 |
| JP | 10-171107 | 6/1998 |

* cited by examiner

Primary Examiner—Richard L. Schilling
(74) Attorney, Agent, or Firm—Dickstein, Shapiro, Morin & Oshinsky, LLP.

(57) ABSTRACT

Provided is a photosensitive copper paste permitting the formation of a fine and thick copper pattern having high adhesion to a substrate, and having excellent preservation stability without causing gelation, and a method of forming a copper pattern, a circuit board and a ceramic multilayer substrate using the photosensitive copper paste. The photosensitive copper paste includes a mixture of an organic binder having an acid functional group, a copper powder and a photosensitive organic component. The copper powder has a surface layer having a thickness of at least 0.1 μm from the surface composed CuO as a main component. The copper powder also has an oxygen content of about 0.8% to 5% by weight.

17 Claims, 2 Drawing Sheets

PHOTOSENSITIVE COPPER PASTE AND METHOD OF FORMING COPPER PATTERN USING THE SAME

BACKGROUND OF THE INVENTION

1. Field of the Invention

The present invention relates to a photosensitive copper paste used for forming a desired electrode pattern on a substrate surface or each of the substrates which constitute a multilayer substrate in manufacturing a circuit board or a multilayer substrate, or the like, and a method of forming a copper pattern using the photosensitive copper paste.

2. Description of the Related Art

Radio-frequency electronic parts used for mobile communication equipment, satellite receivers, computers, etc. have been increasingly miniaturized in recent years and concurrently undergone an increase in performance with miniaturization of these apparatuses. Also, wiring patterns of the radio-frequency electronic parts have strongly been required to support an increase in density and signal transmission speed.

In order to achieve increases in the density and the signal transmission speed of the wiring patterns of the radio-frequency electronic parts, the wiring patterns must be made fine while increasing their thickness (thickening).

A wiring pattern of a radio-frequency electronic part is conventionally formed by a method comprising forming a pattern on an insulating substrate by using a conductor paste containing a conductive metal powder composed of a polyvalent metal such as copper, and an organic vehicle comprising an organic binder and an organic solvent, and then drying the pattern and baking the pattern to form a predetermined wiring pattern.

Although a screen printing method is generally used for forming the wiring pattern, this method makes it difficult to decrease the wiring width and the wiring pitch of the wiring pattern to 50 $\mu$m or less in order to obtain a fine wiring pattern. It is generally recognized that a wiring width and wiring pitch of about 50 $\mu$m or less each are the refining limit of the screen printing method.

On the other hand, a photolithography method of forming fine and thick wiring by using a photosensitive conductor paste is proposed in Japanese Unexamined Patent Application Publication Nos. 5-287221 and 8-227153. This method comprises coating, on an insulating substrate, a photosensitive conductor paste comprising a conductive metal powder, an acrylic copolymer having carboxyl groups and ethylenic unsaturated groups in the side chains thereof, a photoreactive compound and a photopolymerization initiator, drying the coating, and then patterning the coating by photolithography.

Also, a photolithography method of forming fine and thick wiring by using a photosensitive conductor paste containing a glass powder is proposed in Japanese Unexamined Patent Application Publication Nos. 6-224538 and 8-335757. In this method, the glass powder is contained in the photosensitive conductor paste to improve adhesion between the conductor pattern and the ceramic substrate.

In consideration of the environment, the photolithography method using a photosensitive conductor paste has recently been desired to be developed with water or an alkali aqueous solution. Therefore, an acid functional group having the property of liberating protons, such as a carboxyl group or the like, is introduced into the organic binder. However, when a polyvalent metal, particularly copper, is selected as a conductor for the photosensitive conductor paste, the copper ions elute and react with the organic binder anions produced after release of protons to form a three-dimensional network due to ion crosslinkage, thereby causing gelation. The gelation of the photosensitive copper paste causes the problems of difficulties in coating and destabilizing development even if coating can be performed.

As a method of preventing gelation, for example, Japanese Unexamined Patent Application Publication No. 9-218509 discloses a photosensitive conductor paste containing, as a gelation inhibitor, a phosphorus-containing compound such as phosphoric acid; Japanese Unexamined Patent Application Publication No. 9-218508 discloses a photosensitive conductor paste containing a compound having an azole structure, such as benzotriazole; Japanese Unexamined Patent Application Publication No. 9-222723 discloses a photosensitive conductor paste containing an organic compound having a carboxyl group, such as acetic acid. However, the methods of using the gelation inhibitor can only slightly lengthen the time to gelation of the photosensitive copper paste, but difficulties in use of the photosensitive copper paste remain under the present conditions.

Also, in Japanese Unexamined Patent Application Publication No. 10-171107, 3-methyl-3-methoxybutanol is used as an organic solvent for preventing gelation. However, a phenomenon similar to gelation, i.e., a phenomenon in which a three-dimensional network is formed by ion crosslinkage to increase the substantial molecular weight, occurs in the dry paste, thereby causing the problem of failing to elute an unexposed portion with a developer.

SUMMARY OF THE INVENTION

The present invention has been achieved for solving the above problems, and an object of the present invention is to provide a photosensitive copper paste causing less gelation, and exhibiting excellent storage stability and permitting the formation of a fine and thick copper pattern having high adhesion to a substrate. Another object of the present invention is to provide a method of forming a copper pattern, a circuit board and a ceramic multilayer substrate using the photosensitive copper paste.

As a result of various experiments and research performed for achieving the above objects, the inventor found that by using a copper powder having a surface coating of a copper oxide in a system containing an organic binder having an acid functional group and the copper powder, gelation can effectively be inhibited.

Further experiment and examination led to the achievement of the present invention.

A photosensitive copper paste of the present invention comprises a mixture of an organic binder having an acid functional group, a copper powder and a photosensitive organic component, wherein the copper powder comprises a copper oxide coating on the surface thereof, and at least the surface layer having a thickness of about 0.1 $\mu$m from the surface being composed of CuO as a main component.

The photosensitive copper paste of the present invention comprises the copper powder having the surface coating of copper oxide in which at least the surface layer having a thickness of about 0.1 $\mu$m from the surface is composed of CuO as a main component. Therefore, the occurrence of gelation can be sufficiently suppressed either in the paste state before coating or in the coated state after coating and drying. Therefore, the photosensitive copper paste can be coated, patterned by exposure and developed, and then baked to efficiently form a fine and thick copper pattern.

In the photosensitive copper paste of the present invention, the organic binder having an acid functional group is a wide concept representing an organic binder comprising a material having a functional group having the property of releasing protons, such as a: carboxyl group, a hydroxyl group, a sulfonic group or the like, or an organic binder containing a material having the functional group. The type of the acid function group is not limited.

The photosensitive copper paste of the present invention comprises the copper powder having the surface coating composed of CuO as a main component at least in the surface layer having a thickness of about 0.1 $\mu$m from the surface thereof. This is because with the surface layer composed of CuO as a main component and having a thickness of about 0.1 $\mu$m or less, a region (inner layer) composed of $Cu_2O$ as a main component readily occurs in the outermost layer of the copper powder during kneading in the process for producing the photosensitive copper paste.

In the present invention, "composed of CuO as a main component" is a concept representing that the molar ratio of CuO exceeds about 50%. The copper powder preferably has an average particle diameter of about 1 to 10 $\mu$m, and the surface layer composed of CuO as a main component is preferably about 0.1 $\mu$m to 1 $\mu$m.

The photosensitive organic component used in the photosensitive copper paste of the present invention is a conventional known photopolymerizable or photomodifiable compound. Examples of such a compound include the following:

(1) A mixture of a monomer or oligomer having a reactive functional group such as an unsaturated group or the like, and a photo-radical generating agent such as an aromatic carbonyl compound;

(2) A diazo resin such as a condensation product of aromatic bisazide and formaldehyde; and (3) A mixture of an addition polymerizable compound such as an epoxy compound, and a photo-acid generator such as a diallyl iodonium salt or the like; and (4) A naphthoquinone diazide compound.

Of these photosensitive organic components, the mixture of a monomer or oligomer having a reactive functional group such as an unsaturated group or the like, and a photo-radical generator such as an aromatic carbonyl compound is particularly preferred.

Examples of the photo-radical generator include benzyl, benzoin ethyl ether, benzoin isobutyl ether, benzoin isopropyl ether, benzophenone, benzoylbenzoic acid, methyl benzoylbenzoate, 4-benzoyl-4'-methyldiphenylsulfide, benzyl dimethyl ketal, 2-n-butoxy-4-dimethyl aminobenzoate, 2-chlorothioxanthone, 2,4-diethylthioxanthone, 2,4-diisopropylthioxanthone, isopropylthioxanthone, 2-dimethylaminoethyl benzoate, ethyl p-dimethylaminobenzoate, isoamyl p-dimethylaminobenzoate, 3,3'-dimethyl-4-methoxybenzophenone, 2,4-dimethylthioxanthone, 1-(4-dodecylphenyl-2-hydroxy-2-methylpropane-1-one, 2,2-dimethoxy-1,2-diphenylethane-1-one, hydroxycyclohexyl phenyl ketone, 2-hydroxy-2-methyl-1-phenylpropane-1-one, 1-[4-(2-hydroxyethoxy)-phenyl]-2-hydroxy-2-methyl-1-propane-1-one, 2-methyl-1-[4-(methylthio)phenyl]-2-morpholinopropane-1-one, methylbenzoylformate, 1-phenyl-1,2-propanedione-2-(o-ethoxycarbonyl) oxime, 2-benzyl-2-dimethylamino-1-(4-morpholinophenyl)-1-butanone, bis(2,6-dimethoxybenzoyl)-2,4,4-trimethylpentylphosphine oxide, bis(2,4,6-trimethylbenzoyl)phenylphosphine oxide, and the like.

Examples of the monomer or oligomer having a reactive function group include hexanediol triacrylate, tripropylene glycol triacrylate, trimethylolpropane triacrylate, stearyl acrylate, tetrahydrofurfuryl acrylate, lauryl acrylate, 2-phenoxyethyl acrylate, isodecyl acrylate, isooctyl acrylate, dodecyl acrylate, caprolactone acrylate, ethoxynonylphenol acrylate, 1,3-butanediol diacrylate, 1,4-butanediol diacrylate, diethylene glycol diacrylate, tetraethylene glycol diacrylate, triethylene glycol diacrylate, ethoxy bisphenol A diacrylate, propoxyneopentyl glycol diacrylate, tris(2-hydroxyethyl)isocyanurate triacrylate, ethoxy trimethylolpropane triacrylate, pentaerythritol triacrylate, propoxy trimethylolpropane, triacrylate, propoxy glyceryl triacrylate, pentaerythritol tetraacrylate, ditrimethylolpropane tetraacrylate, dipentaerythritol hydroxypentaacrylate, ethoxy pentaerythritol tetraacrylate, tetrahydrofurfuryl methacrylate, cyclohexyl methacrylate, isodecyl methacrylate, lauryl methacrylate, triethylene glycol dimethacrylate, ethylene glycol dimethacrylate, tetraethylene glycol dimethacrylate, 1,4-butanediol dimethacrylate, diethylene glycol dimethacrylate, 1,6-hexanediol dimethacrylate, neopentyl glycol dimethacrylate, 1,3-butylene glycol dimethacrylate, ethoxy bixphenol A dimethacrylate, trimethylolpropane trimethacrylate, and the like.

The photosensitive copper paste of the present invention preferably further contains an ultraviolet absorber. By mixing the ultraviolet absorber, the absorptivity of exposure light can be improved, and exposure failure due to light scattering can be minimized. As the ultraviolet absorber, for example, an azo red pigment, an amine red dye or the like can be used.

The photosensitive copper paste of the present invention may further contain an inorganic component such as a glass powder, a ceramic powder or the like in order to improve adhesion to the substrate. A known glass powder such as borosilicate glass or the like can be used as the glass powder, and a known low-temperature sintering ceramic powder such as alumina, zirconia, crystallized glass ceramic, glass composite ceramic, non-glass ceramic or the like can be used as the ceramic powder.

When the inorganic additive such as the glass powder or ceramic powder contains a polyvalent metal compound, the polyvalent metal may be at least one selected from the group consisting of boron, lead, zinc, bismuth, aluminum, magnesium, calcium, barium, titanium, strontium, zirconium, manganese, cobalt, nickel, iron, yttrium, niobium, lanthanum and ruthenium.

Examples of the glass powder include powders containing oxides of polyvalent metals having a valence of two or more, such as a $SiO_2$—PbO system, a $SiO_2$—ZnO system, a $SiO_2$—$Bi_2O_3$ system, a $SiO_2$—$K_2O$ system, a $SiO_2$—$Na_2O$ system, a $SiO_2$—PbO—$B_2O_3$ system, a $SiO_2$—ZnO—$B_2O_3$ system, a $SiO_2$—$Bi_2O_3$—$B_2O_3$ system, a $SiO_2$—$K_2O$—$B_2O_3$ system, a $SiO_2$—$Na_2O$—$B_2O_3$ system and the like.

Examples of the ceramic powder include powders containing compounds of polyvalent metals having a valence of two or more, such as oxides, borides, nitrides and suicides of at least one polyvalent metal selected from the group consisting of lead, zinc, aluminum, magnesium, calcium, barium, strontium, zirconium, manganese, cobalt, nickel, iron, yttrium, lanthanum and ruthenium.

With the inorganic additive containing a polyvalent metal component, gelation occurs due to reaction with the acid functional group of the organic binder. In order to prevent reaction between the polyvalent metal component in the inorganic additive and the acid functional group of the organic binder, it is effective to add at least one of the following four additives:

(1) Anion-adsorbing material
(2) Thixotropic agent
(3) Alcohol having a boiling point of 178° C. or more
(4) Fatty acid amide The anion-adsorbing material (1) may have the form of inorganic fine particles or organic fine particles. As the inorganic fine particles, hydroxyapatite, hydrotalcite, zirconium phosphate, hydrous antimony oxide and the like are preferably used. As the organic fine particles, an anion exchange resin or the like can be used. Examples of the anion exchange resin include the following:

1. A resin comprising a matrix copolymer of divinylbenzene and acrylate, methacrylate or acrylonitrile, in which a primary, secondary, tertiary or quaternary amino group is incorporated as an ion exchange group;
2. A resin comprising a matrix copolymer of trivinylbenzene and acrylate, methacrylate or acrylonitrile, in which a primary, secondary, tertiary or quaternary amino group is incorporated as an ion exchange group;
3. A resin comprising a matrix copolymer of trimethylolpropane trimethacrylate ester and acrylate, methacrylate or acrylonitrile, in which a primary, secondary, tertiary or quaternary amino group is incorporated as an ion exchange group; and
4. A resin comprising a matrix copolymer of ethylene glycol dimethacrylate ester and acrylate, methacrylate or acrylonitrile, in which a primary, secondary, tertiary or quaternary amino group is incorporated as an ion exchange group.

As the thixotropic agent (2), an agent generally referred to as a "thickening, sagging and sedimentation inhibitor" or "sagging and sedimentation inhibitor", or "pigment wetting, dispersion and sedimentation inhibitor" can be used.

As the "thickening, sagging and sedimentation inhibitor", a vegetable polymerized oil system, a polyether-ester surfactant, a hydrogenated castor oil system, a mixture of a hydrogenated castor oil system and an amide system, a fatty acid amide wax system or the like can be used.

As the "sagging and sedimentation inhibitor", a special fatty acid system, a sulfate ester system, an anionic surfactant, a polyethylene oxide system, a mixture of a polyethylene oxide system and amide system or the like can be used.

As the "pigment wetting, dispersion and sedimentation inhibitor", a fatty acid polyvalent carboxylic acid, a amine salt of high-molecular weight polyester, a polyether-ester anionic surfactant, a long-chain amine salt of high-molecular-weight polycarboxylic acid, a salt of long-chain polyaminoamide and high-molecular acid polyester, a salt of long-chain polyaminoamide and phosphoric acid, a special modified polyamide system, a phosphate ester surfactant, a amidoamine salt of high-molecular polyester acid or the like can be used.

As the alcohol having a boiling point of 178° C. or more, either a monohydric or polyhydric alcohol may be used. Examples of the monohydric alcohol include 1-octyl alcohol, 2-octyl alcohol, nonyl alcohol, decyl alcohol, 1-methylcyclohexanol, trimethylcyclohexanol, ethylene glycol monoacetate, diethylene glycol monobutyl ether, diethylene glycol monoethyl ether, diethylene glycol monohexyl ether, diethylene glycol monomethyl ether, diethylene glycol monoethyl ether, diethylene glycol monovinyl ether, dipropylene glycol monomethyl ether, dipropylene glycol monoethyl ether, dipropylene glycol monobutyl ether, ethylene glycol isoamyl ether, ethylene glycol phenyl ether, ethylene glycol benzyl ether, trimethylhexanol, tetrahydrofurfuryl alcohol, cresol, butyl lactate, benzyl alcohol, hydroxyethyl acrylate, phenethyl alcohol, mercaptobutanol, hydroxyethyl methacrylate, hydroxyethyl piperazine, cyclohexanone oxime, hydroxymethoxyallyl benzene, hydroxymethoxybenzaldehyde, hydroxymethylpiperazine, hydroxypropionitrile, hydroxyactonaphthone, hydroxybenzaldehyde, hydroxyactophenone, hydroxybenzimidazole, phenylphenol, hydroxybenzoic acid, hydroxybenzophenone, benzoin, thymol, hydroxymethoxybenzoic acid, hydroxymethylbenzoic acid, hydroxymethylpyrone, hydroxynaphthoic acid, hydroxynaphthoquinone, hydroxynorbomene dicarboxyimide, hydroxyphenyl acetic acid, hydroxyphenyl glycine, hydroxyphthalimide, hydroxypivalic acid neopentyl glycol ester, hydroxypropiophenone, hydroxystearic acid, hydroxysuccinic imide, hydroxytoluic acid, pentaerythritol diacrylate monostearate, and mixtures thereof.

Examples of the polyhydric alcohol include ethylene glycol, propylene glycol, trimethylene glycol, butylene glycol, tetramethylene glycol, pentamethylene glycol, butenediol, hexamethylene glycol, heptanediol, octanediol, nonanediol, decanediol, diethylene glycol, dipropylene glycol, triethylene glycol, tripropylene glycol, glycerin, hexanetriol, heptanetriol, threitol, erythritol, arabitol, xylitol, ribitol, adonitol, glucitol, mannitol, iditol, talitol, galactitol, allitol, perseitol, volemitol and the like.

Examples of the fatty acid amide (4) include acetic amide, lactic amide, propionic amide, valeric amide, hexanoic amide, heptoic amide, octanoic amide, decanoic amide, nonanoic amide, stearic amide, oleic amide, erucic amide and the like.

The photosensitive copper paste of the present invention may further contain a preservation stabilizer such as a polymerization inhibitor, an antioxidant, a dye, a pigment, an antifoaming agent, a surfactant, etc. according to demand.

In the photosensitive copper paste of the present invention, the oxygen content of the copper powder is preferably about 0.8% by weight to 5% by weight.

By setting the oxygen content of the copper powder in the range of about 0.8% to 5% by weight, the occurrence of gelation can be sufficiently suppressed either in a paste state before coating or in a coating state after coating and drying.

The reason for setting the oxygen content in the range of about 0.8% by weight to 5% by weight is that with the oxygen content of the copper powder of less than about 0.8% by weight, the internal layer composed of $Cu_2O$ as a main component readily appears in the outermost layer during kneading, for example, with three rolls in the process for producing the photosensitive copper paste, thereby failing to prevent gelation. While with the oxygen content of the copper powder of over about 5% by weight, the rate of volumetric shrinkage is increased in the step of reducing and burning the copper pattern formed by using the photosensitive copper paste of the present invention, thereby easily causing disconnection of the formed copper pattern.

In the photosensitive copper paste of the present invention, the copper powder is coated with a copper oxide by heating the copper powder to room temperature or higher in an oxygen-containing atmosphere.

By heating the copper powder to room temperature or higher in the oxygen-containing atmosphere, the copper powder having the surface coating of copper oxide can efficiently be obtained, in which at least the surface layer having a thickness of about 0.1 μm from the surface is composed of CuO as a main component. Therefore, the present invention can be made effective.

The reason why the method of heating in the oxygen-containing atmosphere is preferable as the method of coating the surface the copper powder with a copper oxide is that this method can easily control the CuO state of the surface of the copper powder and can form a dense CuO film.

For example, the present invention can use a copper powder the surface of which is coated with a Cu oxide by a CuO spray method or an oxidation method using a solution containing an oxidizing agent. However, the CuO spray method or the oxidation method using a solution containing an oxidizing agent cannot easily form a dense CuO film. Therefore, from the viewpoint of sufficient prevention of gelation, the copper powder having the surface coated with a Cu oxide by the method of heating in an oxygen-containing atmosphere is preferably used.

In the photosensitive copper paste of the present invention, the volume fraction of the burning residue remaining after burning is preferably about 30% to 89%. This is because with the volume fraction of less than about 30%, volumetric shrinkage significantly occurs during burning to cause disconnection of the formed copper pattern, while with the volume fraction of over about 89%, the strength of the formed copper pattern (before burning) is significantly decreased to cause breakage of the pattern during burning.

In the present invention, the volume fraction of the burning residue represents the volume fraction of the inorganic components (copper, etc.) remaining after burning and contained in a solid obtained by removing the components (the organic solvent, etc.) from the photosensitive copper paste during drying.

In the photosensitive copper paste of the present invention, the organic binder preferably comprises an acrylic copolymer having carboxyl groups in the side chains. By using the acrylic copolymer having the carboxyl groups in the side chains as the organic binder, it is possible to perform development with water or an alkali aqueous solution while suppressing the occurrence of gelation. Also, the organic binder is useful as a photosensitive organic binder.

With the organic binder comprising the acrylic copolymer having the carboxyl groups in the side chains, the carboxyl groups of the acrylic copolymer easily react with $Cu_2O$ in the copper powder. However, even in such a system, gelation can be securely suppressed by using the copper powder having the surface coating composed of CuO as a main component at least in the surface layer having a thickness of about 0.1 μm from the surface.

Examples of the organic binder comprising the acrylic copolymer having carboxyl groups in the side chains can be produced by copolymerizing an unsaturated carboxylic acid and an ethylenic unsaturated compound. Examples of the unsaturated carboxylic acid include acrylic acid, methacrylic acid, maleic acid, fumaric acid, vinylacetic acid, and anhydrides thereof and the like. Examples of the ethylenic unsaturated compound include acrylic acid esters such as methyl acrylate, ethyl acrylate and the like; methacrylic acid esters such as methyl methacrylate, ethyl methacrylate and the like; fumaric acid esters such as monoethyl fumarate and the like. As the acrylic copolymer, the following copolymers may be used, in which an unsaturated bond is incorporated.

(1) A copolymer obtained by adding an acrylic monomer having a functional group such as an epoxy group or the like, which can react with the carboxyl groups in the side chains of the acrylic copolymer, to the carboxyl groups; and (2) A copolymer obtained by reacting the acrylic copolymer having epoxy groups introduced in place of the carboxyl groups in the side chains with an unsaturated monocarboxylic acid, and then introducing a saturated or unsaturated polyhydric carboxylic anhydride.

A method of forming a copper pattern of the present invention comprises the steps of applying the photosensitive copper paste of the present invention on a support member, exposing and developing the photosensitive copper paste to form a predetermined copper pattern on the support member, and transferring the copper pattern formed on: the support member to a substrate.

The method of forming a copper pattern of the present invention uses the photosensitive copper paste of the present invention, which comprises the copper powder having the surface coating of copper oxide in which at least the surface layer having a thickness of about 0.1 μm from the surface is composed of CuO as a main component. Therefore, gelation of the photosensitive copper paste and gelation of the coating after drying can be sufficiently suppressed to form a fine copper pattern with high precision.

In the present invention, a substrate is a wide concept including various types of transfer objects, for example, sintered ceramic substrates such as an alumina substrate and the like, and unsintered ceramic green sheets, and the like.

A circuit board of the present invention comprises a circuit formed by forming a predetermined copper pattern by using the photosensitive copper paste of the present invention, and then burning the copper pattern.

The circuit board of the present invention comprises a fine and thick circuit (copper pattern) formed by forming a predetermined copper pattern by using the photosensitive copper paste of the present invention, and then burning the copper pattern, thereby permitting realization of high-density wiring and high-speed signal which cannot be realized by a conventional circuit board.

A method of producing a ceramic multilayer substrate of the present invention comprises the steps of applying the photosensitive copper paste on a support member, exposing and developing the photosensitive copper paste to form a predetermined copper pattern on the support member, transferring the copper pattern formed on the support member to a ceramic green sheet, laminating ceramic green sheets (on each of which the copper pattern was transferred) to form a laminate, and burning the laminate.

The method of producing a ceramic multilayer substrate of the present invention uses the photosensitive copper paste of the present invention, which comprises the copper powder having the surface coating of a copper oxide, at least the surface layer having a thickness of about 0.1 μm from the surface being composed of CuO as a main component. Therefore, gelation of the photosensitive copper paste and gelation of the coating after drying can be sufficiently suppressed to form a fine copper pattern with high precision, thereby obtaining a ceramic rams multilayer substrate having excellent adaptability to higher density wiring and higher speed signals.

The ceramic multilayer substrate of the present invention is produced by the above described method, and comprises a copper pattern which is formed by applying the photosensitive copper paste of the present invention and burning the coating, and which is provided in the substrate or provided in the substrate and on a surface thereof.

The ceramic multilayer substrate of the present invention comprises a fine and thick circuit (copper pattern) formed by forming a predetermined copper pattern on an insulating substrate by using the photosensitive copper paste of the present invention, and then burning the copper pattern, thereby permitting realization of higher-density wiring and higher-speed signal which cannot be realized by a conventional ceramic multilayer substrate.

In the present invention, the possible reason why gelation is suppressed by using the copper powder having the surface coating of a copper oxide in which at least the surface layer having a thickness of about 0.1 μm from the surface is composed of CuO as a main component is the following.

At room temperature in air, the uppermost (outermost) layer of the copper powder in the level of several nm from the surface is coated with a copper oxide composed of CuO as a main component, but the inner region is composed of $Cu_2O$ as a main component. At room temperature in air, CuO is more stable than $Cu_2O$, and CuO does not react with the acid functional group in the organic binder, while the $Cu_2O$ easily reacts with the acid functional group in the organic binder. Therefore, in producing the photosensitive copper paste by using such copper powder, a thin uppermost layer (the layer composed of CuO as a main component) is separated during kneading (mixing) of the paste, for example, with a three roll mill in the process for producing the photosensitive copper paste, to expose the region (inner layer) composed of $Cu_2O$ as a main component to the uppermost layer of the copper powder, thereby causing gelation due to reaction between $Cu_2O$ and the acid functional group in the organic binder.

On the other hand, in the present invention using a copper powder having the surface coating of a copper oxide in which at least the surface layer having a thickness of about 0.1 μm from the surface is composed of CuO as a main component, the region composed of CuO as a main component has a large thickness, and thus the region (inner layer) composed of $Cu_2O$ as a main component does not appear in the uppermost layer of the copper powder even during kneading of the paste with the three rolls in the process for producing the photosensitive copper paste. Therefore, it is possible to securely suppress the occurrence of gelation due to reaction between $Cu_2O$ and the acid functional group in the organic binder.

DESCRIPTION OF THE PREFERRED EMBODIMENTS

First Embodiment

A method of forming a copper pattern according to an embodiment of the present invention will be described in detail below with reference to the drawings.

Although a negative photosensitive copper paste is described as an example, a positive photosensitive copper paste can also be used by light-dark inversion of a photomask pattern.

Figure 1A:
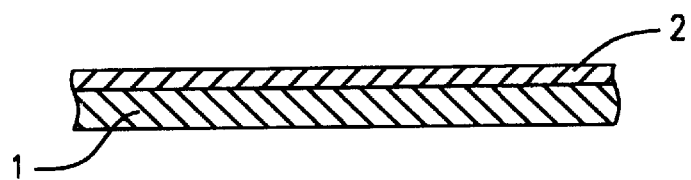
FIGS. 1A, B, C, D and E are sectional views showing a method of forming a copper pattern according to an embodiment of the present invention.

First, as shown in FIG. 1A, a photosensitive paste is coated on a support member 1 by spin coating, screen printing, a doctor blade, or the like, and then dried at 40 to 100° C. for 10 minutes to 2 hours to form a coating film 2 comprising the photosensitive copper paste.

Figure 1B:
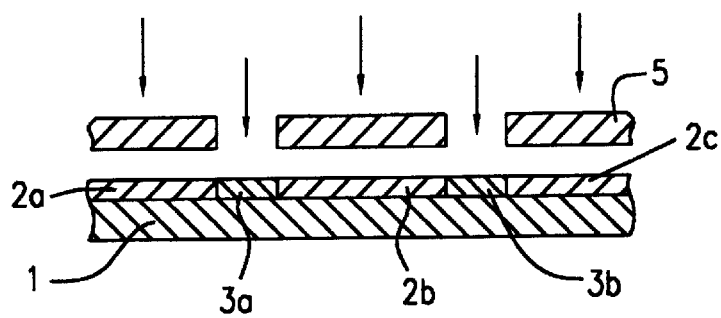

Next, as shown in FIG. 1B, the coating film 2 on the support member 1 is exposed in a predetermined pattern by irradiation with an active ray from a high-pressure mercury lamp with an exposure of 20 to 5000 mJ/cm$^2$ through a mask 5 having a desired pattern formed therein. As a result, the exposed portions 3a and 3b irradiated with the ray are cured to form regions which are not developed by subsequent development.

Figure 1C:
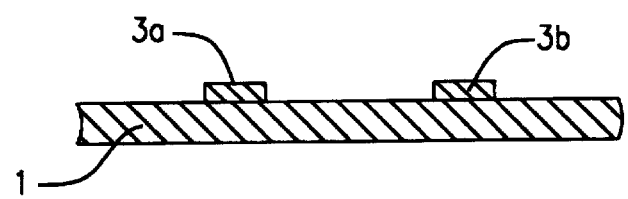

Next, as shown in FIG. 1C, the coating film 2 comprising the exposed portions 3 and 3b and the unexposed portions 2a, 2b and 2c is reacted (i.e., developed) with a. general-purpose alkali aqueous solution such as a sodium carbonate aqueous solution by a spray shower method to elute the unexposed portions 2a, 2b and 2c with the alkali aqueous solution, forming the copper patterns 3a and 3b on the support member 1.

Figure 1D:
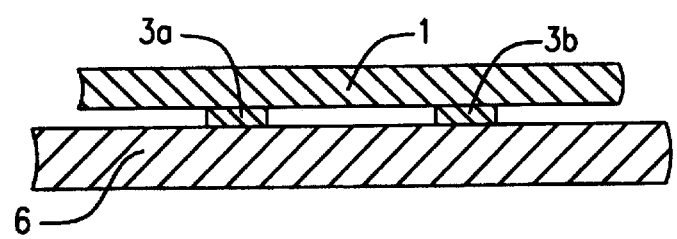

Next, as shown in FIG. 1D, the copper patterns 3a and 3b on the support member 1 are heat-transferred to a ceramic green sheet 6 at 1 to 200 MPa and 50 to 150° C. for 5 seconds to 5 minutes by using a heat press.

Figure 1E:
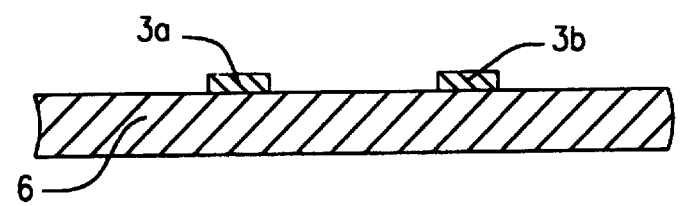

Next, as shown in FIG. 1E, the support member 1 is separated from the ceramic green sheet 6. As a result, the fine and thick copper patterns (unburned copper patterns) 3a and 3b are formed on the ceramic green sheet 6.

The method of forming a copper pattern of the present invention is capable of smoothly coating the photosensitive copper paste on the support member while suppressing gelation of the photosensitive copper paste and sufficiently suppressing gelation of a coating film after drying, thereby permitting stable exposure and development. Therefore, a fine and thick copper pattern can be formed on any desired substrate with high precision.

As the transfer support member 1, for example, a film-shaped support member comprising a polyester film, a polypropylene film, a nylon film or the like can be preferably used.

In order to improve the transferability of the copper pattern, a release agent such as a silicon coat, a wax coat, a melamine coat and the like may be provided on the film-shaped support member. However, the photosensitive copper paste of the present invention has excellent transferability, and thus such release agent is not required. However, in some cases, the property of releasing the support member from the ceramic green sheet is poor depending upon the type and amount of the organic binder used for the ceramic green sheet. In this case, appropriate known surface treatment (release treatment) can be performed.

As the ceramic green sheet, a sheet formed by molding a slurry containing a ceramic powder and an organic vehicle can be used.

Also, the ceramic green sheet may further contain a glass powder, and fine via holes may be formed in a photosensitive ceramic green sheet containing an organic vehicle and a photosensitive organic component by photolithography.

More specifically, as the ceramic green sheet, various ceramic green sheets can be used, which contain, as a ceramic component, an insulating ceramic powder of $Al_2O_3$ or the like, a dielectric ceramic powder of $BaTiO_3$ or the like, a ferrite powder of nickel-zinc ferrite, nickel-zinc-copper ferrite or the like, a conductive ceramic powder of $RuO_2$, $Pb_2Ru_2O_7$, $Bi_2Ru_2O_7$, a compound oxide of Mn.Co.Ni or the like, a piezoelectric ceramic powder such as PZT or the like.

Although the ceramic green sheet is used as the substrate on which a copper patter is formed in the first embodiment, the method of forming a copper pattern of the present invention can be widely used for various applications such as the formation of a copper pattern as an electrode on a printed board, etc.

Second Embodiment

Figure 2:
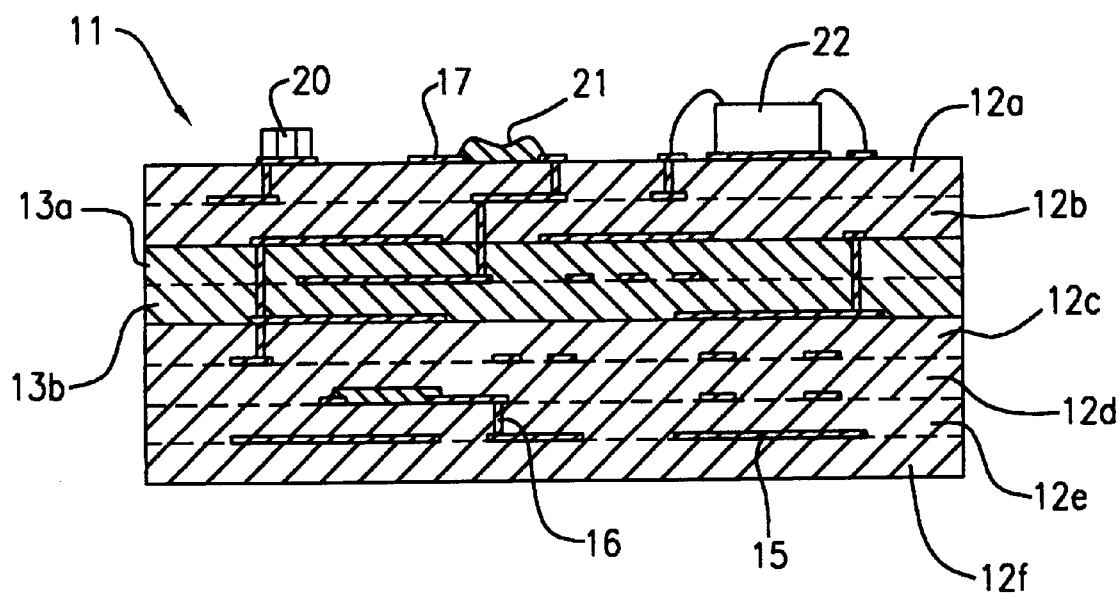
FIG. 2 is a sectional view showing a ceramic multilayer substrate according to an embodiment of the present invention.

FIG. 2 is a sectional view showing a ceramic multilayer substrate according to an embodiment of the present invention. The ceramic multilayer substrate is produced by a method of producing a ceramic multilayer substrate according to an embodiment of the present invention.

The ceramic multilayer substrate 11 shown in FIG. 2 is a multilayer circuit board comprising a laminate of insulator layers 12a, 12b, 12c, 12e and 12f, and dielectric layers 13a and 13b.

Also, a capacitor pattern, a coil pattern, a strip line, etc. are formed in the ceramic multilayer substrate 11 by internal layer copper patterns 15 and via holes 16.

Furthermore, chip parts 20 such as a chip capacitor and the like, a thick resistor 21, a semiconductor IC 22, etc. are provided on one of the main surfaces of the ceramic multilayer substrate 11, and respectively connected to a surface layer copper pattern 17, the internal layer copper patterns 15, and the like.

The method of producing the ceramic multilayer substrate 11 will be described below.

First, a glass powder, a ceramic powder and an organic vehicle are mixed to prepare slurry for insulator ceramic green sheets. Similarly, slurry for dielectric ceramic green sheets is prepared. Next, each of the slurries is formed in a sheet by a doctor blade method, and then dried at a temperature of 50 to 150 C. to form an insulator ceramic green sheet and a dielectric ceramic green sheet.

Then, copper patterns such as a capacitor pattern, a coil pattern and the like, are formed on each of the ceramic green sheets. Also, via holes are formed in each of the green sheets according to demand. The copper patterns are formed according to the method of forming a copper pattern of the first embodiment.

Next, the ceramic green sheets comprising the copper patterns and the via holes formed therein are laminated, compression-bonded together and then burned at a predetermined temperature.

Furthermore, the surface layer copper pattern is formed by the method of forming a copper pattern of the present invention, and then burned at a predetermined temperature.

Next, the chip parts 20 and the semiconductor IC 22 are mounted on the laminate, and the thick resistor 21 is printed thereon to form the ceramic multilayer substrate 11 shown in FIG. 2.

The method of producing a ceramic multilayer substrate of the present invention is capable of smoothly coating a photosensitive copper paste on a support member while suppressing gelation of the photosensitive copper paste, and sufficiently suppressing gelation of a coating film after drying, thereby permitting stable exposure and development. Therefore, a fine and thick copper pattern can be formed on a ceramic green sheet substrate with high precision. Then, the ceramic green sheets on which a copper pattern is formed are laminated, pressure-bonded together and then burned at a predetermined temperature to sufficiently produce a ceramic multilayer substrate which can sufficiently support higher-speed signals and higher-density wiring.

Also, a laminated structure can be formed by coating a mixture containing a functional organic binder on a substrate or support member having a fine pattern formed thereon by using the photosensitive copper paste of the present invention. The laminated structure is then heat-treated by burning to produce a multilayer circuit board or a multilayer circuit element. As the mixture containing a functional organic binder, a mixture comprising the ceramic powder and an organic binder, a mixture containing a conductive metal powder of copper, silver or the like, and an organic binder, and a mixture containing a glass powder can be used.

Third Embodiment

A method of producing a circuit board (or a circuit element) of the present invention will be described.

A circuit board of the present invention is produced by coating a photosensitive copper paste on a substrate by screen printing, spin coating or the like, drying the coating, performing exposure and development to form a predetermined copper pattern (unburned copper pattern), and then heat-treating the copper pattern by burning. The coating of the photosensitive paste is generally dried at 40 to 100° C. for 10 minutes to 2 hours.

The circuit board produced by the photosensitive copper pattern of the present invention permits the formation a fine wiring pattern, for example, having a wiring width and wiring interval of about 50 μm or less each, which cannot be obtained by screen-printing a conventional photosensitive copper paste. Therefore, it is possible to sufficiently realize higher-speed signals and higher-density wiring which cannot be realized by a conventional circuit board.

In the circuit board of the present invention, various ceramic green sheets can be used as the substrate, and a glass substrate can also be used. As the method in which the photosensitive copper paste of the present invention is coated on a ceramic green sheet to form a fine and thick copper pattern, and then heat-treated by burning to produce a circuit board, the method of forming a copper pattern of the first embodiment (FIG. 1) can be used. However, a method comprising coating the photosensitive copper paste of the present invention on a ceramic green sheet and then performing photolithography to directly form a fine pattern can also be used.

The circuit board of the present invention may be a substrate for a circuit element such as a chip capacitor, a chip LC filter or the like, or a substrate for a module such as VCO (Voltage Controlled Oscillator), PLL (Phase Locked Loop) or the like.

By using the photosensitive copper paste of the present invention, development in the photolithography process can stably be carried out, and thus a fine and thick copper pattern required for an electronic circuit comprising via holes, wiring, etc. can be formed, thereby permitting the reliable production of a small circuit board having excellent radio-frequency properties. Therefore, it is possible to sufficiently comply with an increase in the density of radio-frequency chip electronic parts such as a chip inductor, a chip multilayer capacitor or the like, and an increase in signal speed.

EXAMPLES

The present invention is described in further detail below with reference to examples.

Example 1

A copper powder was allowed to stand under conditions of 200° C. and 70 RH% for 24 hours in air to prepare copper powder A having an oxygen content of 1% by weight and an average particle diameter of 3 μm.

It was confirmed by observation on a transmission electron microscope that copper powder A had a surface layer having a thickness of 0.1 μm from the surface and composed of CuO as a main component.

Then, an organic binder, a copper powder, a monomer containing a reactive functional group, a photopolymerization initiator, an organic solvent and an ultraviolet absorber were weighed at the ratio described below, mixed, and kneaded by a three-roll mill to produce a photosensitive copper paste.

Organic Binder
  Copolymer (weight average molecular weight=50,000) at a methacrylic acid/methyl methacrylate copolymerization ratio of 25/75 by weight: 2.0 g
Copper Powder
  Copper powder A: 15.0 g
Monomer Containing a Reactive Functional Group
  Trimethylolpropane triacrylate: 1.0 g
Photopolymerization Initiator
  2-methyl-1-[4-(methylthio)phenyl]-2-morpholinopropane-1-one: 0.4 g 2,4-diethylthioxanthone: 0.1 g
Organic Solvent
  Dipropylene glycol monomethyl ether: 5.0 g
Ultraviolet Absorber
  Azo red pigment: 0.1 g The photosensitive copper paste formed as described above was coated on an alumina insulating substrate by a spin coater, and then dried at 100° C. for 1 hour to form a coating film having a thickness of 20 μm.

The thus-formed coating film was allowed to stand for 24 hours, and then exposed to light. In Example 1, the film was irradiated with light of a high-pressure mercury lamp with an exposure of 50 mJ/cm² through a mask having a pattern at a line/space ratio (L/S) of 20/20 (μm).

Then, development was performed with a sodium carbonate aqueous solution to obtain a copper pattern having a L/S of 20/20 (μm).

After degreasing, the copper pattern was burned at 900° C. in an $N_2$ atmosphere to form a copper pattern having a L/S of 10/30 (μm).

The preservation state (the occurrence of gelation) of the photosensitive paste having the above composition was observed immediately after formation, and after 1 day, 3 days, 1 week, 2 weeks, 3 weeks and 1 month of storage at 20° C. in the air. No gelation occurred in the photosensitive copper paste having the above composition at any time. It was thus confirmed that the photosensitive copper paste can be coated on an insulating substrate by a spin coater and then patterned by photolithography at any of the times immediately after formation, and 1 day after, 3 days after, 1 week after, 2 weeks after, 3 weeks after and 1 month after the formation.

Example 2

A CuO powder having a particle diameter of 0.1 μm or less was sprayed on a copper powder to prepare copper powder B coated with CuO.

The copper powder B was allowed to stand under the condition of 200° C. in an oxygen-containing atmosphere to prepare copper powders having various oxygen contents.

Table 1 shows the presence of a CuO-based layer and the oxygen contents of the copper powder A of example 1, the copper powder B and untreated copper powder H, and copper powders C, D, E, F and G.

TABLE 1

| Type of copper powder | Method of coating copper oxide | Presence of CuO-based layer | Oxygen content (% by weight) |
| --- | --- | --- | --- |
| Copper powder A | Oxidation in air | ◯ | 1 |
| Copper powder B | CuO spray method | ◯ | 1 |
| Copper powder C | Oxidation in oxygen-containing atmosphere | ◯ | 0.8 |
| Copper powder D | Oxidation in oxygen-containing atmosphere | ◯ | 0.7 |
| Copper powder E | Oxidation in oxygen-containing atmosphere | ◯ | 5 |
| Copper powder F | Oxidation in oxygen-containing atmosphere | ◯ | 6 |
| Copper powder G | Oxidation in oxygen-containing atmosphere | X | 1 |
| Copper powder H | None | X | 0.2 |

In Table 1, "Presence of CuO-based layer" represents the results of observation of each copper powder using a transmission electron microscope to see whether or not the layer having a thickness of about 0.1 μm from the surface is composed of CuO as a main component. In the column of "Presence of CuO-based layer", "◯" shows that the layer has a thickness of about 0.1 μm from the surface is composed of CuO as a main component, and "x" shows that the layer has a thickness of about 0.1 μm from the surface is composed of $Cu_2O$ as a main component, not CuO.

A photosensitive copper paste having the same composition as Example 1 was prepared by using each of the copper powders A to G. Then, the preservation state (the occurrence of gelation) of each of the photosensitive pastes was observed immediately after formation, and 1 day, 3 days, 1 week, 2 weeks, 3 weeks and 1 month after the formation when held at 20° C. in the air. The results are shown in Table 2 together with the results of the photosensitive copper paste (Sample No. 1) of Example 1.

TABLE 2

| Sample No. | Type of copper powder | Immediately after | 1 day after | 3 days after | 1 week after | 2 weeks after | 3 weeks after | 1 month after |
| --- | --- | --- | --- | --- | --- | --- | --- | --- |
| 1 | A | ◯ | ◯ | ◯ | ◯ | ◯ | ◯ | ◯ |
| 2 | B | ◯ | ◯ | ◯ | ◯ | ◯ | X | X |
| 3 | C | ◯ | ◯ | ◯ | ◯ | ◯ | ◯ | ◯ |
| 4 | D | ◯ | ◯ | ◯ | ◯ | ◯ | ◯ | X |
| 5 | E | ◯ | ◯ | ◯ | ◯ | ◯ | ◯ | ◯ |
| 6 | F | ◯ | ◯ | ◯ | ◯ | ◯ | ◯ | ◯ |

TABLE 2-continued

| Sample No. | Type of copper powder | Elapsed time and gelation state | | | | | | |
|---|---|---|---|---|---|---|---|---|
| | | Immediately after | 1 day after | 3 days after | 1 week after | 2 weeks after | 3 weeks after | 1 month after |
| 7 | G | ○ | ○ | ○ | ○ | X | X | X |
| 8 | H | ○ | X | X | X | X | X | X |

In Table 2, in evaluation of the gelation state, "○" shows that no gelation occurs in the photosensitive copper paste, permitting coating of the paste, and "x" shows that gelation occurs in the photosensitive copper paste to make coating of the paste impossible.

It was confirmed by Table 2 that in the photosensitive copper paste of Sample No. 8, prepared by using copper powder H which was not coated with copper oxide, gelation occurred after only one day to make coating impossible.

It was also found that in the photosensitive copper pastes of Sample Nos. 1, 3, 5 and 6 prepared by using copper powder coated with CuO in which the layer having a thickness of about 0.1 μm from the surface was composed of CuO as a main component, and the oxygen content of the copper powder was about 0.8% by weight, gelation was sufficiently prevented to permit coating of the paste even 1 month after formation.

It was further found that in the photosensitive copper paste prepared by using copper powder G in which the layer having a thickness of about 0.1 μm from the surface was not composed of CuO as a main component, the time to gelation was longer than the photosensitive copper paste of Sample No. 8 prepared by using copper powder H not coated with copper oxide, but gelation occurred in the photosensitive copper paste with the passage of time to make coating of the paste impossible.

It was further found that in the photosensitive copper paste of Sample No. 2 prepared by using copper powder B coated with CuO by the spray method, rather than oxidation in the oxygen-containing atmosphere, and the photosensitive copper paste of Sample No. 4 prepared by using copper powder D having an oxygen content of less than about 0.8% by weight, gelation occurred within a relatively short time, as compared with the photosensitive copper pastes of Sample Nos. 1, 3, 5 and 6. However, in Samples Nos. 2 and 4, the time to gelation significantly lengthened as compared with Sample No. 8 prepared by using copper powder H not coated with copper oxide, thereby causing an effect to some extent.

Furthermore, exposure, development and burning were carried out by using the photosensitive copper pastes of Samples Nos. 3, 5 and 6 by the same method as Example 1. With the photosensitive copper pastes of Sample Nos. 3 and 5, no disconnection occurred in the copper pattern, while with the photosensitive copper paste of Sample No. 6 having an oxygen content of over about 5% by weight (oxygen content of 6% by weight), disconnection was observed in the formed copper pattern.

These result indicate that with an oxygen content in the range of about 0.8% to 5% by weight, a most preferable result is obtained.

Example 3

(1) A slurry obtained by mixing 37.3 g of borosilicate glass powder, 24.9 g of alumina powder, 6.2 g of copolymer (weight average molecular weight=50,000) having a methacrylic acid/methyl methacrylate copolymerization ratio of 25/75 by weight, 3.1 g of ethanol and 0.5 g of dipropylene glycol monomethyl ether was formed in a sheet by the doctor blade method, and then dried at 100° C. for 1 hour to obtain a ceramic green sheet having a thickness of 30 μm.

(2) Next, a copper pattern having a L/S of 20/20 (am) was formed on a polyethylene terephthalate (PET) film by using the photosensitive paste of Example 1 by the same method as Example 1.

(3) Next, the PET film was superposed on the ceramic green sheet, then heat-pressed under the conditions of 10 MPa and 60° C. for 1 minute and then the PET film was separated to heat-transfer the copper pattern onto the ceramic green sheet. The same process was repeated to obtain five ceramic green sheets on each of which a copper pattern was formed.

(4) Next, the thus-formed ceramic green sheets were laminated and then heat-pressed under the conditions of 200 MPa and 60° C. for 1 minute.

(5) Then, the resultant multilayer pressure-bonded product was burned at 900° C. in $N_2$.

As a result, a ceramic multilayer substrate (multilayer alumina substrate) containing copper patterns with a LIS of 10/30 (μm) was obtained.

Example 4

(1) A slurry (the same slurry as Example 3) obtained by mixing 37.3 g of borosilicate glass powder, 24.9 g of alumina powder, 6.2 g of copolymer (weight average molecular weight=50,000) having a methacrylic acid/methyl methacrylate copolymerization ratio of 25/75 by weight, 3.1 g of ethanol and 0.5 g of dipropylene glycol monomethyl ether was coated, by the doctor blade method, on a PET film on which a copper pattern was formed by the same method as Example 3.

(2) After drying at 50° C. for 1 hour and heat-pressing under the conditions of 10 MPa and 60° C. for 1 minute, the PET film was separated to form a ceramic green sheet on which the copper patter was formed. The same process was repeated to form five ceramic green sheets on each of which a copper pattern was formed.

(3) Next, the thus-formed ceramic green sheets were laminated, and then heat-pressed under the conditions of 200 MPa and 60° C. for 1 minute.

(5) Then, the resultant multilayer pressure-bonded product was burned at 900° C. in $N_2$.

As a result, a ceramic multilayer substrate (multilayer alumina substrate) containing copper patterns with a LUS of 10/30 (μm) was obtained.

A photosensitive copper paste of the present invention comprises a copper powder having a surface coating of a copper oxide, the surface layer having a thickness of about 0.1 μm from the surface being composed of CuO as a main component. Therefore, the occurrence of gelation can be sufficiently suppressed either in the paste state before coating or in the coated state after coating and drying. Therefore, the photosensitive copper paste can be coated, patterned by exposure and development, and then baked to efficiently form a fine and thick copper pattern.

When the oxygen content of the copper powder is about 0.8% by weight to 5% by weight, the occurrence of gelation can be sufficiently suppressed either in the paste state before coating and in the coated state after coating and drying, thereby making the present invention more effective.

When the copper powder is coated with a copper oxide by heating the copper powder to room temperature or higher in an oxygen-containing atmosphere, the copper powder having the surface coating of a copper oxide in which at least the surface layer having a thickness of about 0.1 $\mu$m from the surface is composed of CuO as a main component can efficiently be obtained. Therefore, the present invention can be made more effective.

Furthermore, by setting the volume fraction of the burning residue remaining after burning in the range of about 30% to 89%, volumetric shrinkage can be significantly suppressed during burning to cause securely form a conductor pattern (copper pattern after burning) without disconnection.

By using an acrylic copolymer having carboxyl groups in the side chains as an organic binder, it is possible to perform development with water or an alkali aqueous solution while suppressing the occurrence of gelation. Also, the organic binder is useful as a photosensitive organic binder.

A method of forming a copper pattern of the present invention uses the photosensitive copper paste comprising the copper powder having the surface coating of a copper oxide, at least the surface layer having a thickness of about 0.1 $\mu$m from the surface being composed of CuO as a main component. Therefore, gelation of the photosensitive copper paste and gelation of the coating after drying can be sufficiently suppressed to form a fine copper pattern with high precision.

A circuit board of the present invention comprises a fine and thick circuit (copper pattern) formed by forming a predetermined copper pattern by using the photosensitive copper paste of the present invention and then burning the copper pattern, thereby permitting realization of high-density wiring and high-speed signal which cannot be realized by a conventional circuit board.

A method of producing a ceramic multilayer substrate of the present invention uses the photosensitive copper paste of the present invention comprising the copper powder having the surface coating of a copper oxide, at least the surface layer having a thickness of about 0.1 $\mu$m from the surface being composed of CuO as a main component. Therefore, gelation of the photosensitive copper paste and gelation of the coating after drying can be sufficiently suppressed to form a fine copper pattern with high precision, thereby obtaining a ceramic multilayer substrate having excellent adaptability to higher density wiring and higher speed signals.

The ceramic multilayer substrate of the present invention comprises a fine and thick copper pattern formed on an insulating substrate by using the photosensitive copper paste of the present invention and burning the coating, thereby permitting realization of higher-density wiring and higher-speed signal which cannot be realized by a conventional ceramic multilayer substrate.

What is claimed is:

1. A photosensitive copper paste comprising a mixture of an organic binder having an acid functional group, a copper powder and a photosensitive organic component;

wherein the copper powder has a surface layer comprising CuO as a main component; and the surface layer extends from the surface of the powder to a thickness of at least about 0.1 $\mu$m.

2. The photosensitive copper paste according to claim 1, wherein the copper powder has an average particle diameter of about 1 to 10 $\mu$m.

3. The photosensitive copper paste according to claim 2, wherein the oxygen content of the copper powder is about 0.8% to 5% by weight.

4. The photosensitive copper paste according to claim 3, wherein the amounts of the components of the paste are such that the volume fraction of the residue remaining after burning is about 30% to 89%.

5. The photosensitive copper paste according to claim 4, wherein the organic binder comprises an acrylic copolymer having a carboxyl group-containing side chain.

6. The photosensitive copper paste according to claim 5, wherein the CuO is an in situ layer generated by heating the copper powder to room temperature or higher in an oxygen-containing atmosphere.

7. The photosensitive copper paste according to claim 1, wherein the oxygen content of the copper powder is about 0.8% to 5% by weight.

8. The photosensitive copper paste according to claim 1, wherein the CuO is an in situ layer generated by heating the copper powder to room temperature or higher in an oxygen-containing atmosphere.

9. The photosensitive copper paste according to claim 1, wherein the amounts of the components of the paste are such that the volume fraction of the residue remaining after burning is about 30% to 89%.

10. The photosensitive copper paste according to claim 1, wherein the organic binder comprises an acrylic copolymer having a carboxyl group-containing side chain.

11. A method of making the photosensitive paste according to claim 1, comprising:

providing a copper powder having a surface layer comprising CuO as a main component and the surface layer extends to a thickness of at least about 0.1 $\mu$m from the surface of the powder; and combining said powder with an organic binder having an acid functional group and a photosensitive organic component.

12. A method of making the photosensitive paste according to claim 11, wherein said providing comprises heating copper powder to at least room temperature in an oxygen-containing atmosphere.

13. A method of forming a copper pattern comprising applying a photosensitive copper paste according to claim 1 on a support member.

14. A method of forming a copper pattern according to claim 13 further comprising:

photo-exposing and developing a portion of the photosensitive copper paste to form a predetermined copper pattern on the support member; and transferring the copper pattern from the support member to a substrate.

15. The method of forming a copper pattern according to claim 14, further comprising preparing the photosensitive copper paste by a process which comprises heating copper powder to room temperature or higher in an oxygen-containing atmosphere.

16. The method of forming a copper pattern according to claim 13, further comprising burning the copper paste.

17. The method of forming a copper pattern according to claim 13, further comprising:

photo-exposing and developing a portion of the photo-sensitive copper paste to form a predetermined copper pattern on the support member;

transferring the copper pattern from the support member to a ceramic green sheet;

laminating a plurality of ceramic green sheets on each of which the copper pattern had been transferred, to form a laminate, and:

burning the laminate.

* * * * *